(12) United States Patent  (10) Patent No.: US 8,975,942 B2
Bardsley et al.                (45) Date of Patent:    Mar. 10, 2015

(54) SYSTEM FOR A CLOCK SHIFTER CIRCUIT

(75) Inventors: Scott G. Bardsley, Gibsonville, NC (US); Peter Derounian, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/409,525

(22) Filed: Mar. 1, 2012

(65) Prior Publication Data

US 2013/0229220 A1    Sep. 5, 2013

(51) Int. Cl.
  *H03L 5/00*   (2006.01)
  *H03K 5/135*  (2006.01)

(52) U.S. Cl.
  CPC .................................. *H03K 5/135* (2013.01)
  USPC ............................. 327/333; 326/62; 326/81

(58) Field of Classification Search
  USPC ................... 326/62–63, 80–81; 327/306, 333
  See application file for complete search history.

(56) References Cited

U.S. PATENT DOCUMENTS

| 6,118,326 | A   | 9/2000 | Singer et al. |
| 7,265,581 | B2* | 9/2007 | Yeh ................................. 326/63 |
| 7,362,624 | B2  | 4/2008 | Sun |
| 7,414,453 | B2* | 8/2008 | Tachibana et al. ............. 327/333 |
| 7,586,358 | B2* | 9/2009 | Park et al. ..................... 327/333 |
| 7,772,884 | B2  | 8/2010 | Kwon |
| 7,920,017 | B2  | 4/2011 | Kelly et al. |
| 2006/0105586 | A1 | 5/2006 | Zhang et al. |

OTHER PUBLICATIONS

International Search Report and Written Opinion dated Apr. 4, 2013, issued in corresponding International Application No. PCT/US2013/028525, 8 pages.

* cited by examiner

*Primary Examiner* — Dinh Le
(74) *Attorney, Agent, or Firm* — Kenyon & Kenyon, LLP

(57) ABSTRACT

A clock shifter circuit may receive a input clock in a first voltage domain and may generate a level-shifted output clock in a second voltage domain. The circuit may include a cross-coupled pair of transistor switches and a pair of capacitors. Each switch may have a drain coupled to one of the capacitors, a source coupled to a circuit supply voltage, and a gate coupled to the other capacitor. One capacitor may receive a true input clock version, while the other may receive a complement version. Each capacitor, in an alternating manner, may activate an opposing transistor switch to charge its capacitor during an active phase of its respective input clock. The circuit may generate the output clock from an output node connected between one of the transistor switches and its capacitor. The output clock may drive a load directly coupled to the output node.

28 Claims, 8 Drawing Sheets

100

100

300

400

500

600

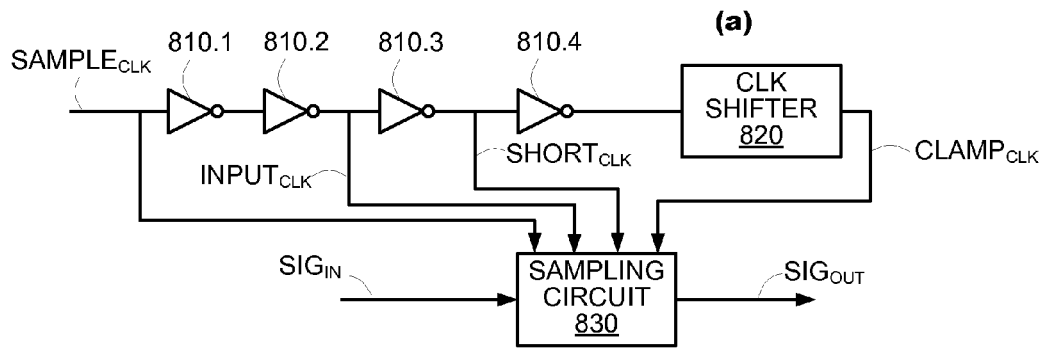
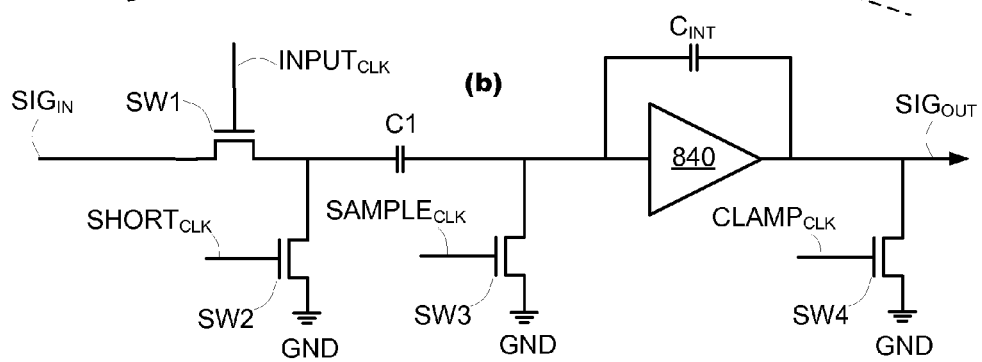
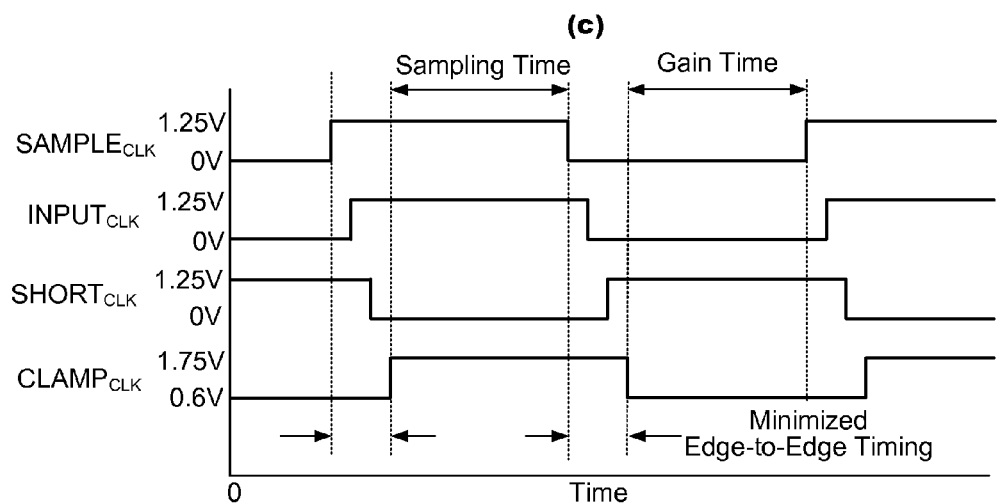
FIG. 8
800

SYSTEM FOR A CLOCK SHIFTER CIRCUIT

BACKGROUND

A clock shifter is an electronic circuit that level-shifts an input clock signal from a first voltage domain to a higher (or lower) second voltage domain output clock signal. Clock shifters have been manufactured using a pair of cross-coupled transistor switches with a corresponding pair of coupling capacitors connected between each transistor source and a true or complement version of an input clock signal. An output node of the shifter circuit is tied to a series switch, which controls voltage boosting for the circuit to generate the second voltage domain output clock.

A conventional clock shifter circuit is described in U.S. Pat. No. 6,118,326, assigned to Analog Devices, Inc., the assignee of the present invention. This clock shifter circuit receives a high-current supply voltage in order to level-shift an input clock signal. The high-current supply voltage boosts a voltage level of an output node for the shifter circuit to above the supply voltage level to activate the transistor switches. The circuit employs a series-coupled output switch in order to boost the output node voltage level to greater than the supply voltage for activating the transistor switches.

A need in the art exists to supplement the above described shifter circuit to improve clock shifting performance.

BRIEF DESCRIPTION OF THE DRAWINGS

FIG. 8 illustrates a sampling system for use with embodiments of the present invention.

DETAILED DESCRIPTION

Embodiments of the present invention provide a clock shifter circuit that may receive a input clock signal in a first voltage domain and may generate a level-shifted output clock signal in a second voltage domain. The shifter circuit may include a cross-coupled pair of transistor switches and a pair of capacitors. Each switch may have a drain coupled to one of the capacitors and a source coupled to a circuit supply voltage. A gate of each switch may be coupled to the other capacitor. One capacitor may receive a true version of the input clock, while the other may receive a complement version of the input clock. Each capacitor, in an alternating manner, may activate an opposing transistor switch to charge its capacitor during an active phase of its respective input clock signal. The clock shifter circuit may generate the second domain output clock from an output node connected between one of the transistor switches and its capacitor. The output clock signal may drive a load directly coupled to the output node.

The clock shifter circuit of the present embodiments may improve performance by eliminating the need for boosting the transistor gate voltages above the supply voltage level to render each transistor switch conductive. This improvement may decrease the size requirements for both the transistor switches and capacitors in the shifter circuit as well as decrease the power consumption for the shifter circuit. The capacitors may have a long charging time constant relative to the clock period of the input clock, therefore allowing for minimum sized transistor switches. Decreasing the size of the transistor switches may allow for a lower current supply voltage (as compared the shifter circuit noted above), which may further decrease power consumption for a clock shifter circuit of the present embodiments. Decreasing the size of the transistor switches and the capacitors may also reduce the silicon area of the clock shifter circuit.

Other improvements for a clock shifter circuit configuration according to embodiments of the present invention are achieved by eliminating a series-coupled output switch from the circuit. Removing the series-coupled output switch may minimize propagation delay through the clock shifter circuit, which may improve phase alignment for the output clock signal as compared to the input clock signal. Moreover, removing the series-coupled output switch and its associated control circuitry further reduces the silicon area of the shifter circuit. In turn, further reducing power consumption of the shifter circuit of the present embodiments.

Figure 1:
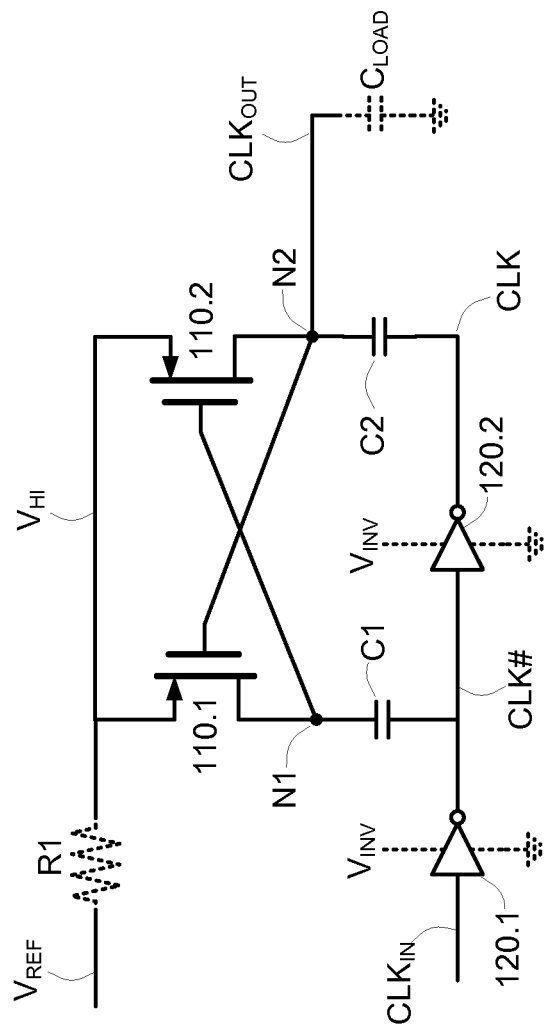
FIG. 1 illustrates a clock shifter circuit according to an embodiment of the present invention.

FIG. 1 illustrates a clock shifter circuit 100 according to an embodiment of the present invention. As illustrated in FIG. 1, the clock shifter circuit 100 may include a pair of cross-coupled transistor switches 110.1, 110.2, a pair of coupling capacitors C1, C2, and a pair of cascaded inverters 120.1, 120.2. Each transistor switch 110.1, 110.2 may have a source coupled to a supply voltage $V_{HI}$. An output clock $CLK_{OUT}$ may be taken from a node N2 where a capacitor C2 is coupled to a drain of transistor switch 110.2.

At a first common node N1, a gate of transistor switch 110.2 may be coupled to a drain of transistor switch 110.1. A first coupling capacitor C1 may have a first terminal coupled to the transistor switch 110.1 drain at the first common node N1 and a second terminal coupled to a first inverter 120.1 output. The first inverter 120.1 may receive a first domain input clock signal $CLK_{IN}$ at its input. The first inverter 120.1 may generate a complement input clock version, labeled "CLK#," at its output. The first capacitor C1 second terminal may also be coupled to a second inverter 120.2 input.

At a second common node N2, a gate of transistor switch 110.1 may be coupled to a drain of transistor switch 110.2. A second coupling capacitor C2 may have a first terminal coupled to the transistor switch 110.2 drain at the second node N2 and a second terminal coupled to the second inverter 120.2 output. The second inverter 120.2 may receive the complement clock, CLK#, at its input and may generate a true input clock version, labeled "CLK," at its output. The second node N2 may be referred to as an output node for the shifter circuit 100. A load circuit, shown here as "$C_{LOAD}$," may be coupled directly to the output node N2 for receiving the output clock $CLK_{OUT}$.

The input clock $CLK_{IN}$ may be a binary signal that transitions between two first domain voltage levels—a low level and a high level. The circuit may generate the level-shifted output clock $CLK_{OUT}$ that, at steady state, may alternate between a low level and a high level in a second voltage domain. The supply voltage $V_{HI}$ may determine the high voltage level for the output $CLK_{OUT}$. The supply voltage $V_{HI}$ may be generated from a voltage source $V_{REF}$ driven across an impedance R1. A circuit designer may design the supply voltage $V_{HI}$ by changing $V_{REF}$ in order to set the high voltage level for the output clock $CLK_{OUT}$ to suit individual application needs.

During operation, each switching transistor 110.1, 110.2 may be activated, in an alternating manner, based on the voltage level of the input clock $CLK_{IN}$ and charge corresponding coupling capacitors C1, C2 toward the high first domain voltage level. The high first domain voltage level may be related to a supply voltage $V_{INV}$ for each inverter 120.1, 120.2. The time required to charge the coupling capacitors C1, C2 may be based on the respective sizes of each capacitor, an "on" resistance of each transistor 110.1, 110.2, the resistance R1, and the period of the input clock signal $CLK_{IN}$. The charging time constant for the coupling capacitors may be long relative to the clock period of the input clock $CLK_{IN}$. The capacitor sizes may be adjusted by circuit designers according to operating requirements for the shifter circuit 100 (i.e., the desired second domain voltage levels and/or the clock period of the input clock $CLK_{IN}$). In this manner, the high first domain voltage level may be used to set the low second domain voltage level for the level-shifted output clock $CLK_{OUT}$. Thus, the output clock $CLK_{OUT}$ may have voltages alternating between approximately $V_{HI}$, for the high voltage level, and approximately $(V_{HI}-V_{INV})$ for the low voltage level.

As noted, the output clock $CLK_{OUT}$ may drive the capacitive load $C_{LOAD}$. The capacitive load $C_{LOAD}$ may induce attenuation on the output clock $CLK_{OUT}$ low voltage level. The $CLK_{OUT}$ low voltage level may be described by the following equation: $V_{HI}-V_{INV}*(C2/C2+C_{LOAD})$. A circuit designer may adjust the sizing for capacitor C2 to set a desired low voltage level for the output clock signal $CLK_{OUT}$ based on the capacitance of the load to be driven. The resistor R1, as shown in FIG. 1, illustrates that a high impedance source receiving the voltage $V_{REF}$ may be used to generate the source potential $V_{HI}$ at a low current level for the shifter circuit 100. A higher impedance reference voltage may consume less power than a reference having a low output impedance.

Although the transistor switches 110.1, 110.2 as illustrated in FIG. 1 are shown as PMOS transistor switches, a clock shifter circuit may also be configured with NMOS transistor switches. An output clock for a clock shifter circuit configured with NMOS transistor switches may be level shifted to a lower second domain voltage level than a first domain input clock (i.e., generate a down-shifted output clock).

Figure 2:
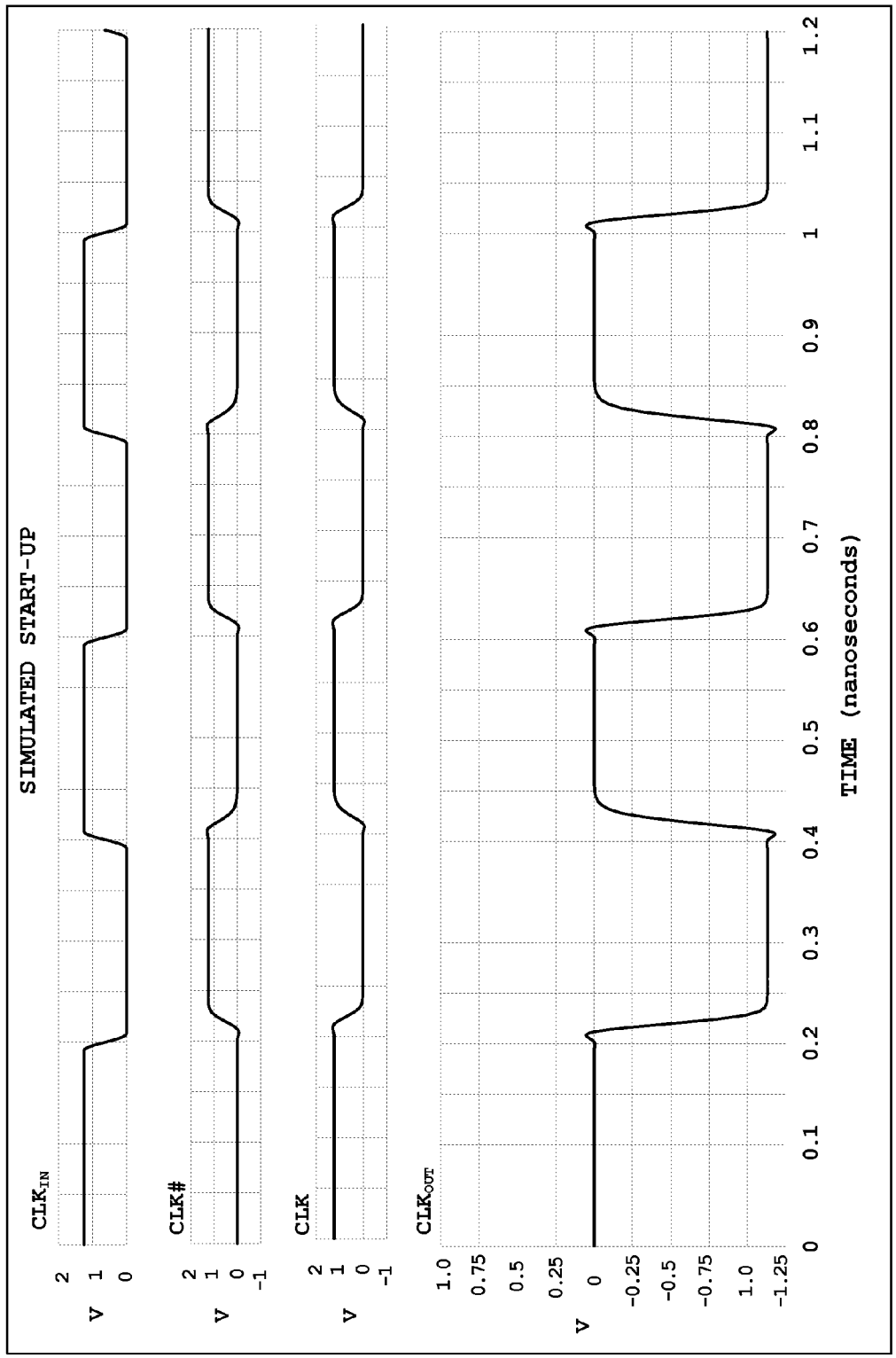
FIG. 2 is a graph simulating start-up operation of the clock shifter circuit of FIG. 1.

FIG. 2 is a graph 200 simulating start-up operation of the clock shifter circuit of FIG. 1. For the simulated operation as illustrated in FIG. 2, the supply voltage $V_{HI}$, may be set to 2.5V and the inverter supply voltages $V_{INV}$ may be set to 1.25V. Thus, the input clock $CLK_{IN}$ may oscillate between approximately 0V-1.25V. Similarly, the true clock version CLK and the complement version clock CLK# may also oscillate between approximately 0V-1.25V. As illustrated, between 0 nS and approximately 0.2 nS, the true clock CLK may be at 1.25V, which may begin to charge capacitor C2 toward 1.25V. The output clock $CLK_{OUT}$ may be at 0V during this period. Between 0.2 nS and 0.4 nS, the true clock CLK may transition to 0V, thus transitioning the output clock $CLK_{OUT}$ to −1.25V. The clock shifter circuit may operate in this manner until the voltage across capacitor C2 charges to 1.25V.

The time required to charge C2 may depend on the size of the capacitor, the "on" resistance of transistor 110.2, the resistance of R1, and the period of the input clock $CLK_{IN}$. As noted, the charging time constant of the capacitors C1, C2 may be large relative to the period of the input clock $CLK_{IN}$, which may allow for minimum sized transistor switches 110.1, 110.2, therefore decreasing silicon area for the shifter circuit 100.

Figure 3:
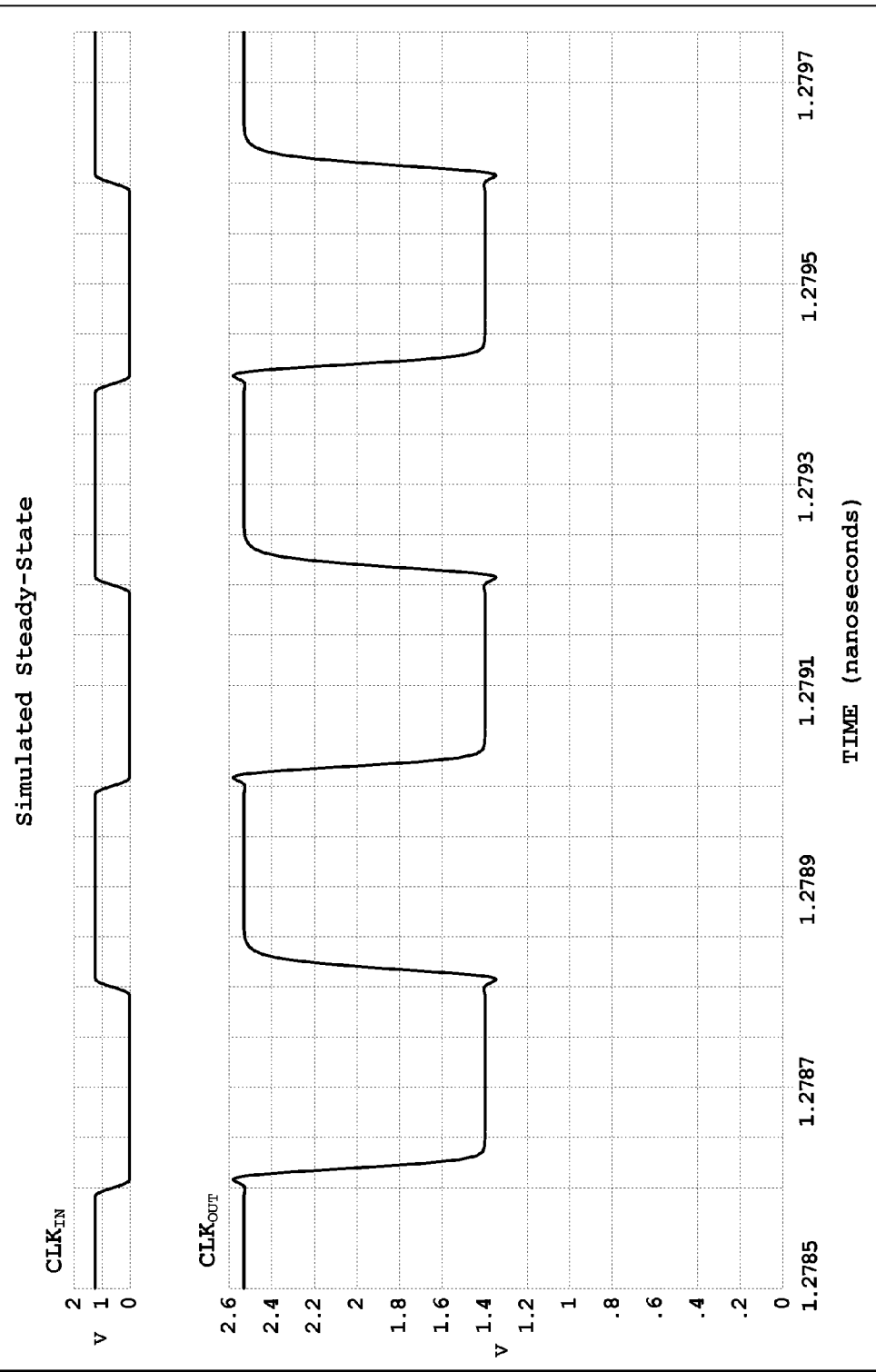
FIG. 3 is a graph simulating steady-steady state operation of the clock shifter circuit of FIG. 1.

Upon charging capacitor C2, the circuit 100 may enter steady-state operation. FIG. 3 is a graph 300 simulating steady-state operation for the clock shifter circuit of FIG. 1. During steady-state operation, the output clock $CLK_{OUT}$ may oscillate between approximately 1.25V-2.5V. As shown, the output clock $CLK_{OUT}$ may be phase aligned generally with the input clock $CLK_{IN}$.

Figure 4:
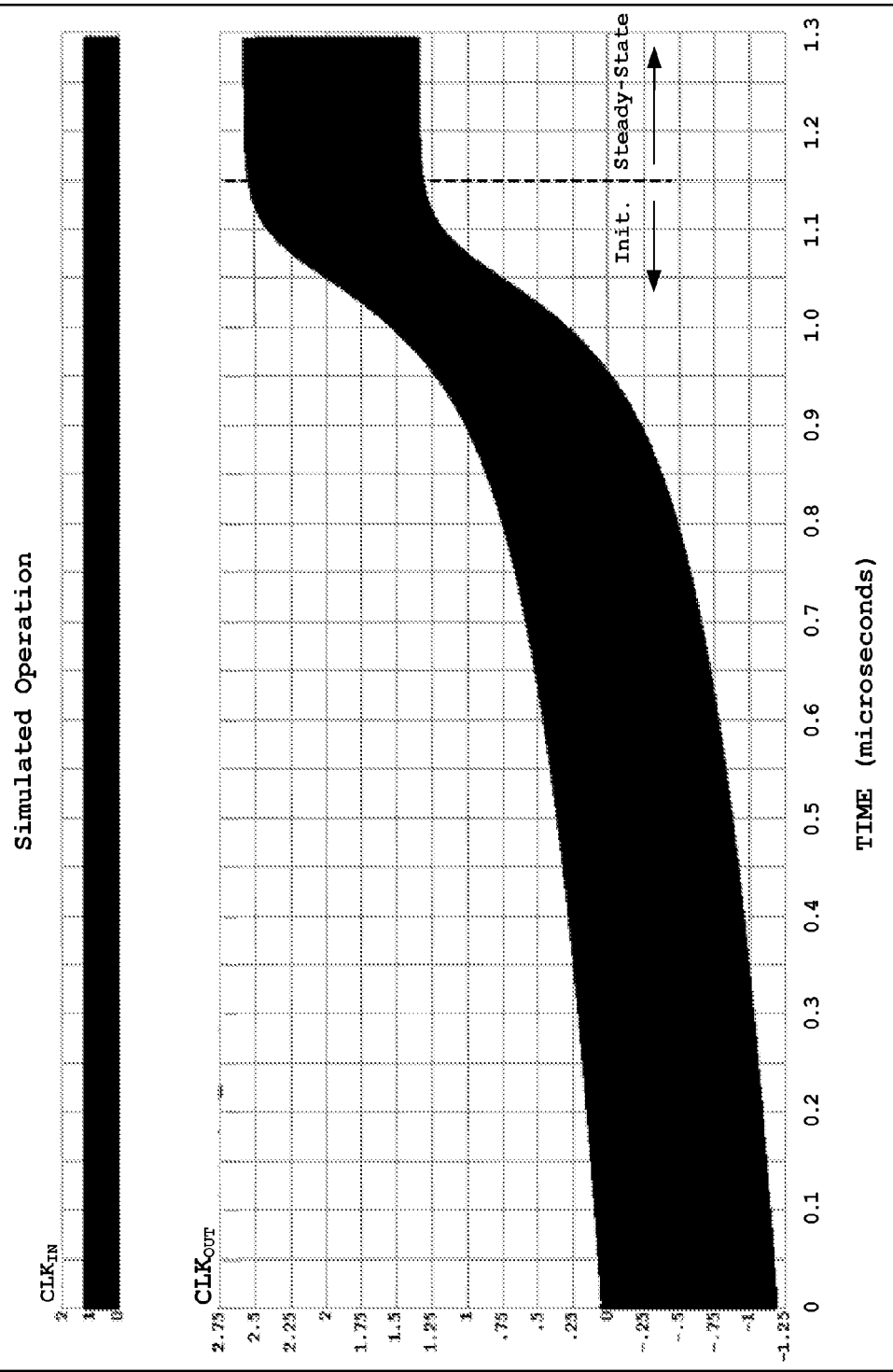
FIG. 4 is a graph simulating operation of the clock shifter circuit of FIG. 1.

FIG. 4 is a graph 400 simulating operation for the clock shifter circuit of FIG. 1. At the time scale shown in FIG. 4, transitions of the input clock $CLK_{IN}$ and the output clock $CLK_{OUT}$ are not shown individually. For the simulated operation as illustrated in FIG. 4, the input clock $CLK_{IN}$ may oscillate between 0-1.25V, while the output clock $CLK_{OUT}$ may alternate between approximately 1.25V-2.5V during steady-state.

As illustrated, start-up for the clock shifter circuit may occur between approximately 0-1.15 μS, during which time capacitor C2 may charge to approximately 1.25V. When the capacitor C2 is charged (after approximately 1.15 μS), the clock shifter circuit may enter steady state operation and the output clock $CLK_{OUT}$ may oscillate between approximately 1.25V-2.5V. The simulated charge times and voltages as illustrated in FIGS. 2-4 is provided for exemplary purposes and does not limit application of the shifter circuit 100 to the charge times and voltages described in the simulations.

Figure 5:
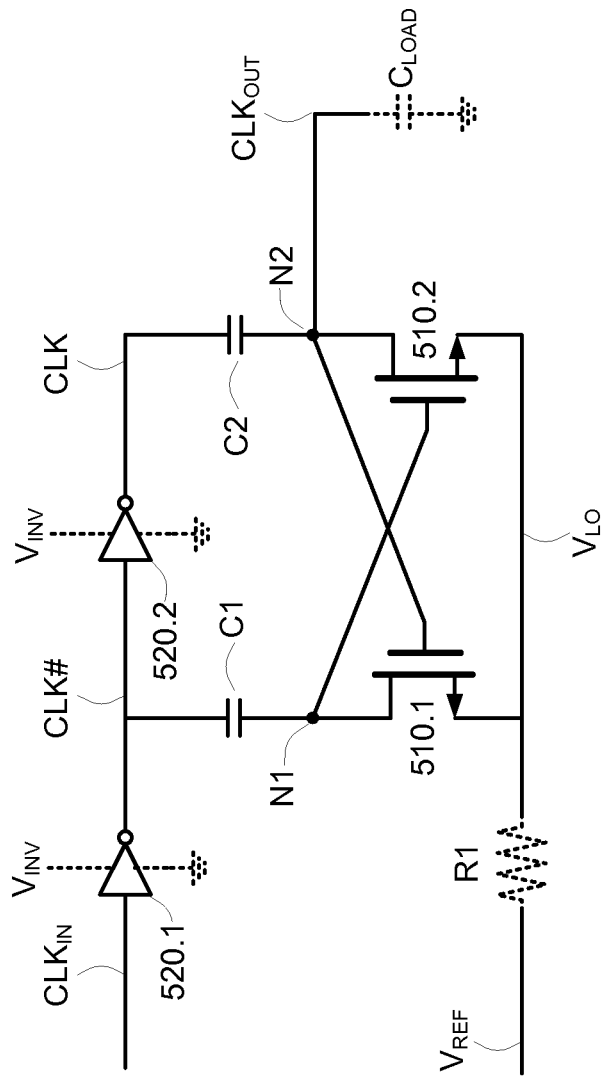
FIG. 5 illustrates another clock shifter circuit according to an embodiment of the present invention.

FIG. 5 illustrates a clock shifter circuit 500 configured with NMOS transistor switches according to an embodiment of the present invention. As illustrated in FIG. 5, the shifter circuit may include a pair of cross-coupled transistor switches 510.1, 510.2, a pair of coupling capacitors C1, C2, and a pair of cascaded inverters 520.1, 520.2. Each transistor switch 510.1, 510.2 may have a source coupled to a supply voltage $V_{LO}$. An output clock $CLK_{OUT}$ may be taken from a common node N2 where capacitor C2 may be coupled to a drain of transistor switch 510.2.

At a first common node N1, a gate of transistor switch 510.2 may be coupled to a drain of transistor switch 510.1. A first coupling capacitor C1 may have a first terminal coupled to the transistor switch 510.1 drain at the first common node N1 and a second terminal coupled to a first inverter 520.1 output. The first inverter 520.1 may receive an input clock $CLK_{IN}$ at its input. The first inverter 520.1 may generate a complement input clock version, labeled "CLK#," at its output. The first capacitor C1 second terminal and the first inverter 520.1 output may also be coupled to a second inverter 520.2 input.

At the second common node N2, a gate of transistor switch 510.1 may be coupled to a drain of transistor switch 510.2. A second coupling capacitor C2 may have a first terminal coupled to the transistor switch 510.2 drain at the second node N2 and a second terminal coupled to the second inverter 520.2 output. The second inverter 520.2 may receive the complement clock, CLK#, at its input and may generate a true input clock version, labeled "CLK," at its output. The second node N2 may be referred to as an output node for the shifter circuit 100. A load circuit, shown here as "$C_{LOAD}$," may be coupled directly to the output node N2 for receiving the output clock $CLK_{OUT}$.

The shifter circuit 500 may operate in a manner similar to shifter circuit 100 of FIG. 1, however, the output clock $CLK_{OUT}$ may be down-shifted in relation to the voltage levels of the input clock $CLK_{IN}$ based on a supply voltage for $V_{INV}$ for inverters 520.1, 520.2. In an embodiment, the clock shifter circuit 500 may be driven by a high impedance source, shown here as a source potential $V_{REF}$ being driven through a resistor R1 to generate the transistor supply voltage $V_{LO}$.

Figure 6:
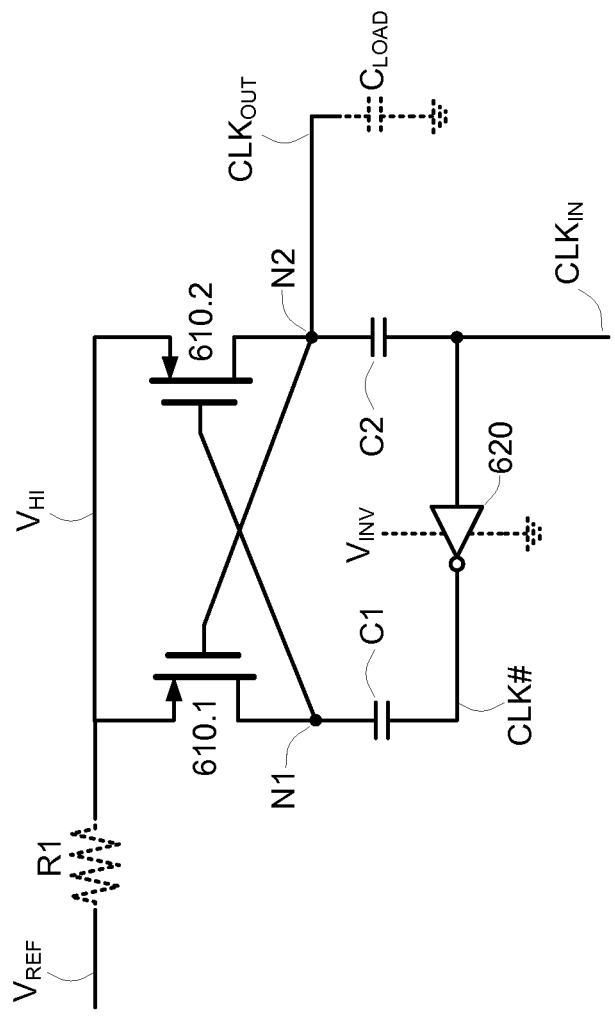
FIG. 6 illustrates another clock shifter circuit according to an embodiment of the present invention.

Transition delays between the input clock $CLK_{IN}$ and the output clock $CLK_{OUT}$ may be minimized by removing one of the inverters within the clock shifter circuit and directly driving the output node capacitor with the input clock $CLK_{IN}$. FIG. 6 illustrates a single inverter clock shifter circuit 600 according to an embodiment of the present invention. As illustrated in FIG. 6, the clock shifter circuit 600 may include a pair of cross-coupled transistor switches 610.1, 610.2, a pair of coupling capacitors C1, C2, and an inverter 620. Each of the transistor switches 610.1, 610.2 may have a source coupled to a supply voltage $V_{HI}$. An output clock $CLK_{OUT}$ may be taken from a common node N2 where capacitor C2 may be coupled to a drain of transistor switch 610.2.

At a first common node N1, a gate of transistor switch 610.2 may be coupled to a drain of transistor switch 610.1. A first coupling capacitor C1 may have a first terminal coupled to the first common node N1 and a second terminal coupled to the inverter 620 output. At the second common node, N2, a gate of transistor switch 610.1 may be coupled to a drain of transistor switch 610.2. A second coupling capacitor C2 may have a first terminal coupled to the second common node N2 and a second terminal coupled to the inverter 620 input, which may also receive a first domain input clock $CLK_{IN}$. In an embodiment, the clock shifter circuit 600 may be driven by a high impedance source, shown here as a source potential $V_{REF}$ being driven through a resistor R1. The inverter 620 may receive a supply voltage $V_{INV}$.

The clock shifter circuit 600 may operate in a manner similar to circuit 100 of FIG. 1. However, clock shifter circuit 600 may minimize transition delays between the input clock $CLK_{IN}$ and the output clock $CLK_{OUT}$ as compared to clock shifter circuit 100 of FIG. 1 by coupling the input clock CLKIN directly to the output node capacitor C2.

Figure 7:
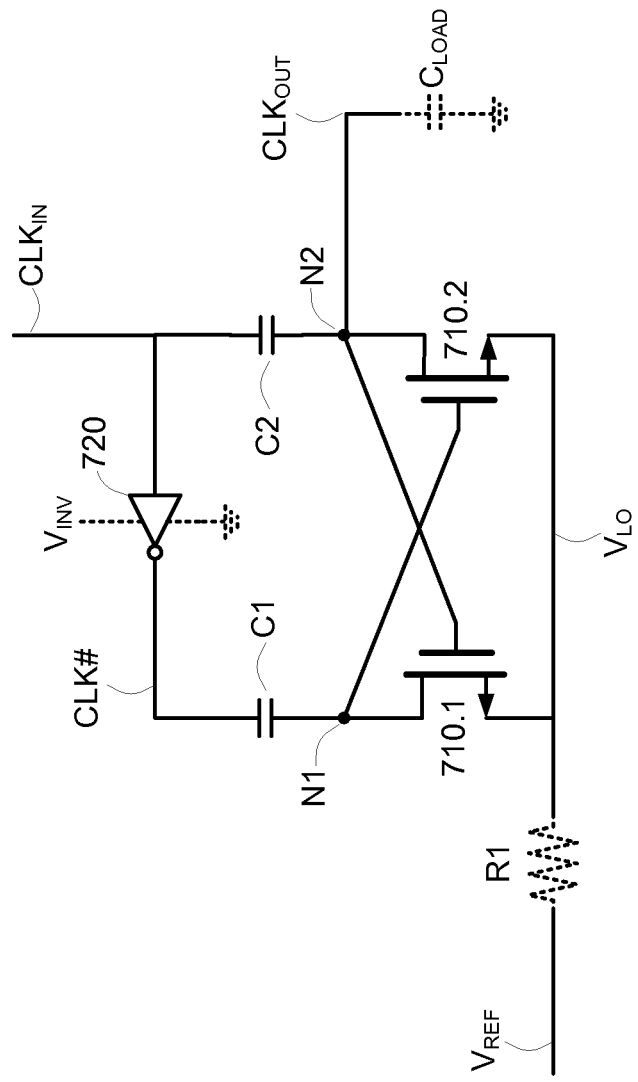
FIG. 7 illustrates another clock shifter circuit according to an embodiment of the present invention.

FIG. 7 illustrates a single inverter clock shifter circuit 700 configured with NMOS transistor switches according to an embodiment of the present invention. As illustrated in FIG. 7, the clock shifter circuit 700 may include a pair of cross-coupled transistor switches 710.1, 710.2, a pair of coupling capacitors C1, C2, and an inverter 720. Each of the transistor switches 710.1, 710.2 may have a source coupled to a supply voltage $V_{LO}$. An input clock $CLK_{IN}$ may be coupled to an input of inverter 720. An output clock $CLK_{OUT}$ may be taken from a common node N2 where capacitor C2 may be coupled to a drain of transistor switch 710.2.

At a first common node N1, a gate of transistor switch 710.2 may be coupled to a drain of transistor switch 710.1. A first coupling capacitor C1 may have a first terminal coupled to the first common node N1 and a second terminal coupled to an output from inverter 720. At the second common node, N2, a gate of transistor switch 710.1 may be coupled to a drain of transistor switch 710.2. A second coupling capacitor C2 may have a first terminal coupled to the second common node N2 and a second terminal coupled to the inverter 720 input.

The clock shifter circuit 700 may operate in a manner similar to clock shifter circuit 600 of FIG. 6 (for opposite polarity voltages). The second domain output clock $CLK_{OUT}$ may be a down-shifted version of the first domain input clock $CLK_{IN}$. In an embodiment, the clock shifter circuit 700 may be driven by a high impedance source, shown here as a source potential $V_{REF}$ being driven through a resistor R1.

FIG. 8 illustrates a sampling system 800 for use with embodiments of the present invention. The sampling system 800 may be realized as an analog-to-digital converter ("ADC"), a digital-to-analog converter ("DAC"), a multiplying DAC, a sample-and-hold system, or any other similar sampling system. As illustrated in FIG. 8(a), the sampling system 800 may include a series of cascaded buffers 810.1-810.4, a clock shifter circuit 820, and a sampling circuit 830. The sampling circuit 830 may receive an input signal $SIG_{IN}$ and generate a sampled output signal $SIG_{OUT}$. The cascaded buffers 810.1-810.4 may generate various control clocks for the sampling circuit 830. A sampling clock $SAMPLE_{CLK}$ may be input to a first buffer 810.1. The sampling clock $SAMPLE_{CLK}$ may be delayed through buffers 810.1 and 810.2. Buffer 810.2 may generate a control clock $INPUT_{CLK}$. Buffer 810.3 may generate a control clock $SHORT_{CLK}$. The clock shifter 820 may generate a level-shifted control clock $CLAMP_{CLK}$.

FIG. 8(b) provides a block diagram of the sampling circuit 830. The sampling circuit 830 may include a set of transistor switches SW1-SW4, an input capacitor C1, an integrating capacitor $C_{INT}$, and an operational amplifier ("op-amp") 840. A first switch SW1 may be controlled by the control clock $INPUT_{CLK}$. A second switch SW2 may be controlled by the control clock $SHORT_{CLK}$. A third switch SW3 may be controlled by the control clock $SAMPLE_{CLK}$. A fourth switch SW4 may be controlled by the control clock $CLAMP_{CLK}$, which may be level-shifted by the clock shifter 820

A first terminal of the first switch SW1 may receive the input signal $SIG_{IN}$ and a second terminal may be coupled to a terminal of the capacitor C1. The second terminal of the first switch SW1 may further be coupled to a first terminal of the second switch SW2. The second switch SW2 may have a second terminal coupled to ground GND. Another terminal of capacitor C1 may be coupled to a first input terminal of the third switch SW3 and an input of the op-amp 840. A second terminal of the third switch SW3 may be coupled to ground GND. An output of the op-amp 840 may be coupled to the op-amp input across the integrating capacitor $C_{INT}$. The op-amp 840 may generate the output signal $SIG_{OUT}$. The fourth switch SW4 may have a first terminal coupled to the op-amp 840 output and a second terminal coupled to ground GND.

During operation, control clocks $INPUT_{CLK}$ and $SAMPLE_{CLK}$ may control charging of the capacitor C1 to a voltage level based on the input signal $SIG_{IN}$. FIG. 8(c) is a graph simulating operation of the sampling circuit 830. FIG. 8(c) illustrates a "sampling time" during which the capacitor C1 is charged. The control clocks $INPUT_{CLK}$ and $SAMPLE_{CLK}$ may vary between 0V-1.25V. During this time, the op-amp 840 output may be tied to ground GND via the fourth switch SW4. Upon sampling of the input signal $SIG_{IN}$, control clocks $SHORT_{CLK}$ and $CLAMP_{CLK}$ may control application of the C1 charge to op-amp 840, which may generate the output signal $SIG_{OUT}$. FIG. 8(c) illustrates a "gain time" during which the op-amp 840 may generate the output signal $SIG_{OUT}$.

As illustrated, the level-shifted control clock $CLAMP_{CLK}$ may vary between approximately 0.6V-1.75V. The increased voltage for control clock $CLAMP_{CLK}$ may reduce the "on" resistance of the fourth switch SW4, therefore decrease the switching time for the switch. The decreased switching time may minimize the edge-to-edge timing for the sampling circuit 830, which may maximize the sampling time of the input signal $SIG_{IN}$ and maximize the gain time of the op-amp 840 to generate the output signal $SIG_{OUT}$.

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

We claim:

1. A level-shifter circuit, comprising:
   a pair of capacitors respectively coupled to opposing clock signal sources at first terminals thereof;
   a pair of cross-coupled transistor switches, each transistor switch connected between a supply voltage and a second terminal of a respective capacitor along a source-to-drain path and connected to second terminal of the other capacitor at its gate; and
   an output terminal of the level-shifter circuit taken directly from one of the second terminals of a capacitor,
   wherein the output terminal is configured to output a clock signal alternating between the supply voltage and a voltage level to a capacitance load, wherein the voltage level is determined based on a difference between the supply voltage and another supply voltage supplying power for the opposing clock signal sources, and wherein the pair of capacitors and the pair of cross-coupled transistor switches are sized proportionally to each other such that the output terminal outputs a startup clock signal alternating between a ground voltage of the supply voltage and a negative of the another supply voltage supplying power for the opposing clock signal sources.

2. The circuit of claim 1, further comprising a pair of cascaded inverters, an output of a first inverter coupled to a first one of the capacitors, and an output of a second inverter coupled to a second one of the capacitors, the first inverter coupled to a clock input to the level-shifter circuit.

3. The circuit of claim 1, further comprising an inverter, an input of the inverter coupled to a first one of the capacitors and to a clock input to the level-shifter circuit, and an output of the inverter coupled to a second one of the capacitors.

4. The circuit of claim 3, wherein the clock input to the level-shifter circuit is coupled to the first terminal of a capacitor and the output terminal of the level-shifter circuit is coupled to the second terminal of the capacitor.

5. The circuit of claim 1, wherein the transistor switches are minimally sized based on a predetermined minimum component size of manufacturing processes for the circuit.

6. The circuit of claim 1, wherein the capacitors each have a charging time constant larger than a clock period of the clock signal sources.

7. The circuit of claim 1, wherein the transistor switches are PMOS transistor switches.

8. The circuit of claim 7, wherein each transistor switch becomes conductive within a transistor threshold voltage up to the supply voltage.

9. The circuit of claim 1, wherein the transistor switches are NMOS transistor switches.

10. The circuit of claim 9, wherein each transistor switch becomes conductive within a transistor threshold voltage down to the supply voltage.

11. A level-shifter circuit, comprising:
    a pair of capacitors respectively coupled to opposing clock signal sources at first terminals thereof;
    a pair of cross-coupled transistor switches, each transistor switch connected between a supply voltage and a second terminal of a respective capacitor along a source-to-drain path and connected to the second terminal of the other capacitor at its gate, each transistor switch to become conductive when a voltage at its gate overcomes a transistor threshold voltage based on the supply voltage; and
    an output terminal of the level-shifter circuit taken directly from one of the second terminals of a capacitor,
    wherein the output terminal is configured to output a clock signal alternating between the supply voltage and a voltage level to a capacitance load, wherein the voltage level is determined based on a difference between the supply voltage and another supply voltage supplying power for the opposing clock signal sources, and wherein the pair of capacitors and the pair of cross-coupled transistor switches are sized proportionally to each other such that the output terminal outputs a startup clock signal alternating between a ground voltage of the supply voltage and a negative of the another supply voltage supplying power for the opposing clock signal sources.

12. The circuit of claim 11, further comprising a pair of cascaded inverters, an output of a first inverter coupled to a first one of the capacitors, and an output of a second inverter coupled to a second one of the capacitors, the first inverter coupled to a clock input to the level-shifter circuit.

13. The circuit of claim 11, further comprising an inverter, an input of the inverter coupled to a first one of the capacitors and to a clock input to the level-shifter circuit, and an output of the inverter coupled to a second one of the capacitors.

14. The circuit of claim 11, wherein the transistor switches are PMOS transistor switches.

15. The circuit of claim 11, wherein the transistor switches are NMOS transistor switches.

16. The circuit of claim 11, wherein the capacitors each have a charging time constant larger than a clock period of the clock signal sources.

17. A level-shifter circuit, comprising:
    a pair of capacitors;
    a pair of cross-coupled transistor switches, each transistor switch connected between a supply voltage and a first terminal of a respective capacitor along a source-to-drain path and connected to the first terminal of the other capacitor at its gate, each transistor switch to become conductive when a voltage at its gate overcomes a transistor threshold voltage based on the supply voltage;
    an output terminal of the level-shifter circuit taken directly from one of the first terminals of a capacitor; and
    an inverter, an input of the inverter coupled to a second terminal of a first one of the capacitors and to a clock input to the level-shifter circuit, and an output of the inverter coupled to a second terminal of a second one of the capacitors,
    wherein the output terminal is configured to output a clock signal alternating between the supply voltage and a voltage level to a capacitance load, wherein the voltage level is determined based on a difference between the supply voltage and another supply voltage supplying power for the clock input, and wherein the pair of capacitors and the pair of cross-coupled transistor switches are sized proportionally to each other such that the output terminal outputs a startup clock signal alternating between a ground voltage of the supply voltage and a negative of the another supply voltage supplying power for the opposing clock signal sources.

18. The circuit of claim 17, wherein the transistor switches are PMOS transistor switches.

19. The circuit of claim 17, wherein the transistor switches are NMOS transistor switches.

20. The circuit of claim 17, wherein the capacitors each have a charging time constant larger than a clock period of the clock signal sources.

21. A level-shifter circuit, comprising:
a pair of transistor switches, each transistor switch having a gate coupled to a drain of an opposing transistor, each transistor switch having a source coupled to a supply voltage, the drain of each transistor coupled to a first terminal of a corresponding capacitor;
a first capacitor having a second terminal receiving a complement version of an input clock signal;
a second capacitor having a second terminal receiving a true version of the input clock signal; and
an output node connected between one of the transistor switches and its corresponding capacitor, the output node coupled directly to a load,
wherein the output node is configured to output a clock signal alternating between the supply voltage and a voltage level to a capacitance load, wherein the voltage level is determined based on a difference between the supply voltage and another supply voltage supplying power for the input clock signal, and wherein the first and second capacitors and the pair of transistor switches are sized proportionally to each other such that the output node outputs a startup clock signal alternating between a ground voltage of the supply voltage and a negative of the another supply voltage supplying power for the input clock signal.

22. The circuit of claim 21, further comprising a first inverter having an output coupled to the second terminal of the first capacitor and an input for receiving the input clock signal.

23. The circuit of claim 22, further comprising a second inverter having an output coupled to the second terminal of the second capacitor and an input coupled to the output of the first inverter.

24. The circuit of claim 21, wherein the supply voltage is generated by a device having a high output impedance.

25. The circuit of claim 21, wherein the transistor switches are PMOS transistor switches.

26. The circuit of claim 21, wherein the transistor switches are NMOS transistor switches.

27. The circuit of claim 21, wherein the transistor switches are minimally sized based on a predetermined minimum component size of manufacturing processes for the circuit.

28. The circuit of claim 21, wherein the capacitors each have a charging time constant larger than a clock period of the clock signal sources.

* * * * *